(12) United States Patent
Egitto et al.

(10) Patent No.: US 7,083,901 B2
(45) Date of Patent: Aug. 1, 2006

(54) JOINING MEMBER FOR Z-INTERCONNECT IN ELECTRONIC DEVICES WITHOUT CONDUCTIVE PASTE

(75) Inventors: Frank D. Egitto, Binghamton, NY (US); Voya Markovich, Endwell, NY (US); Thomas R. Miller, Endwell, NY (US); Douglas O. Powell, Endicott, NY (US); James R. Wilcox, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 183 days.

(21) Appl. No.: 10/262,724

(22) Filed: Oct. 1, 2002

(65) Prior Publication Data

US 2004/0063040 A1   Apr. 1, 2004

(51) Int. Cl.
*G03C 5/00*    (2006.01)
*H01K 3/00*    (2006.01)

(52) U.S. Cl. ............... 430/320; 430/311; 430/317; 430/324; 29/830; 29/846; 29/852; 29/860

(58) Field of Classification Search ............... 430/320, 430/323, 311, 317, 324; 205/48, 79, 239, 205/920; 427/97, 126.1, 126.5; 29/846, 29/860, 830, 852; 174/262
See application file for complete search history.

(56) References Cited

U.S. PATENT DOCUMENTS

| | | | |
|---|---|---|---|
| 4,889,962 A | * | 12/1989 | Hagner .................. 174/250 |
| 4,980,034 A | * | 12/1990 | Volfson et al. ............ 205/122 |
| 5,744,758 A | | 4/1998 | Takenouchi et al. ........ 174/255 |
| 6,662,443 B1 | * | 12/2003 | Chou et al. .................. 29/852 |

* cited by examiner

*Primary Examiner*—Thorl Chea
(74) *Attorney, Agent, or Firm*—Schmeiser, Olsen & Watts; William H. Steinberg

(57) ABSTRACT

A layer for use in a modular assemblage for supporting ICES is formed with metal contacts for assembly by making a sandwich of metal interconnect members between two layers of dielectric; drilling holes through the dielectric, stopping on a metal layer bonded to the bottom surface of the module; forming blind holes stopping on the interconnect members; and plating metal through the volume of the via, both full and blind holes, thereby forming vertical and horizontal connections in a layer that be stacked to form complex interconnect assemblies.

28 Claims, 4 Drawing Sheets

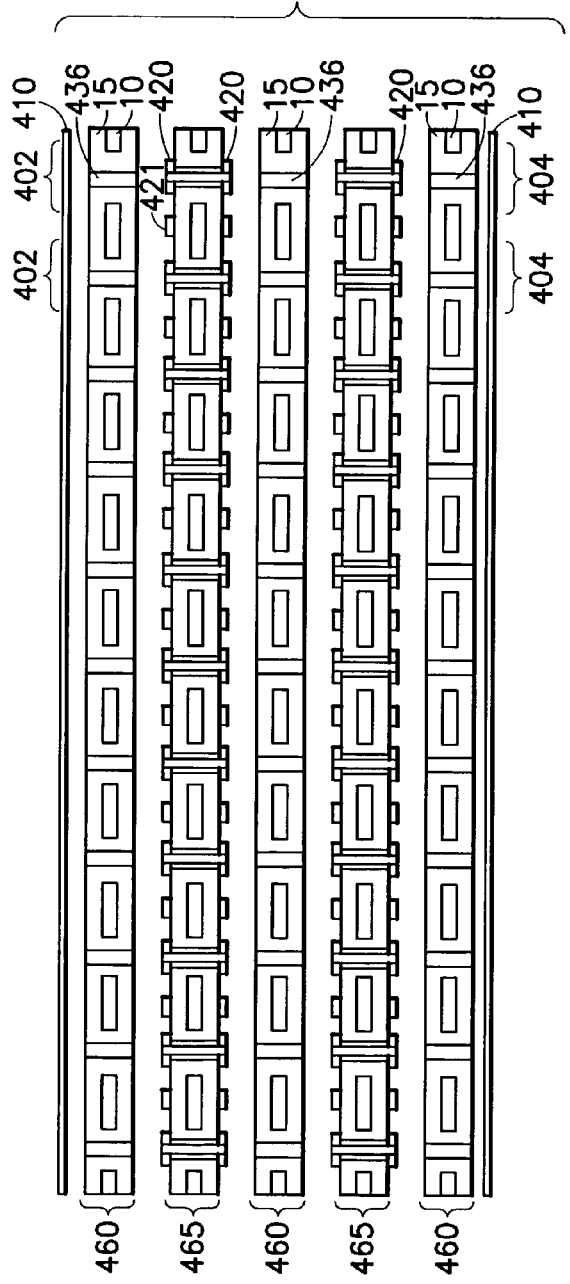
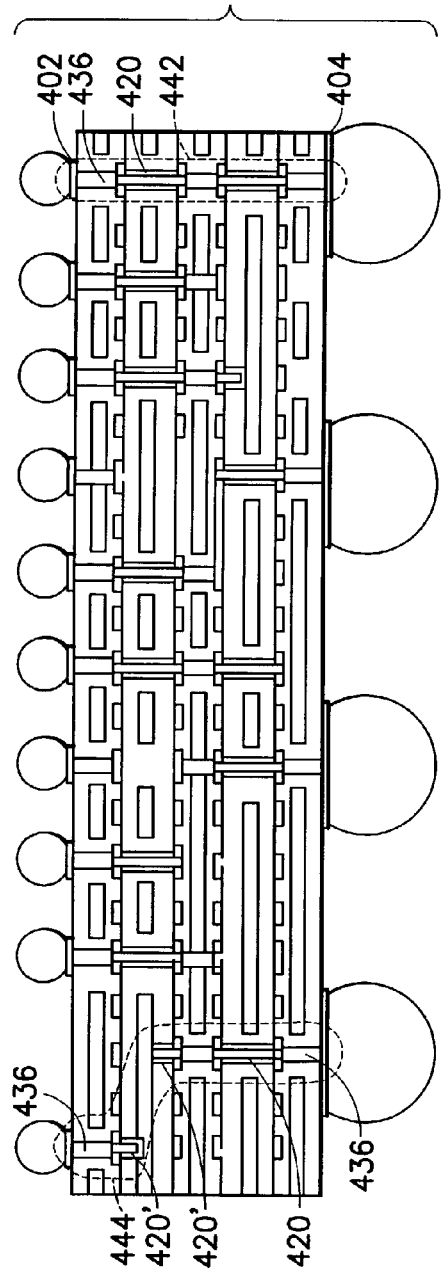
FIG. 4A PRIOR ART
FIG. 4B PRIOR ART

JOINING MEMBER FOR Z-INTERCONNECT IN ELECTRONIC DEVICES WITHOUT CONDUCTIVE PASTE

TECHNICAL FIELD

The field of the invention is that of packaging integrated circuits, in particular assembling layers of dielectric surrounding metal interconnections that support and connect integrated circuits.

BACKGROUND OF THE INVENTION

In assembling composite sets of interconnections surrounded by insulators, the art has used a "Z-connection" method in which layers of conducting materials are connected using an electrically conductive paste.

Typically, as shown in FIGS. 4A and 4B, a set of dielectric sheets 460 and 465 having metal connections embedded in them have a set of vertical visa and horizontal metal lines or sheets. The horizontal lines or sheets 10 are placed between two sheets of dielectric 15 that are bonded in a sandwich. (Layer 10 is optional.) Holes or apertures between the metal sheets provide vertical connections. Fixed metal visa 420 formed by plating are used together with visa 436 formed by forcing a conductive paste made of epoxy or other plastic filled with a metal powder into a hole. Top and bottom layers 410 are made of copper or other metal. The metal is etched to define contact pads at locations 402 and 404 on which solder bumps are placed The assemblage is bonded together, by a lamination process performed at elevated temperatures and pressures such that the dialectic materials stick to each other and to the metal. The assemblage in FIG. 4A is generic and the one in FIG. 4B is customized. On the right of FIG. 4B, denoted with dotted line 442, a set of vertical members make a vertical path between upper and lower contacts 402 and 404. On the left in FIG. 4B, denoted by a dotted line 444, a conductive paste via 436 extends downwardly from a solder ball in the upper left of the Figure. A half-via 420' connects via 436 to a horizontal line 10, at the end of which a second half-via 420' makes contact with the next via 436. Two more visa carry the path down to the lower solder ball.

Those skilled in the art will appreciate that use of conductive paste gives rise to various problems: the paste is messy—it squeezes out of holes and can cause short circuits unless carefully cleaned up.

The paste is thick and often does not fill a hole properly, especially blind holes, causing an open circuit or higher resistivity than specified.

Paste particle size can be a problem in filling small holes. Pastes containing silver are expensive.

These problems are addressed by the present invention.

SUMMARY OF THE INVENTION

The invention relates to a set of modules for forming IC packaging in which the vertical members are formed by plating.

A feature of the invention is drilling holes through a dielectric sheet, stopping on a layer metal layer and thereby forming a hole penetrating through the dielectric and having a closed bottom.

A feature of the invention is plating a contact layer of a second metal at the bottom of the hole before plating a first metal through the bulk of the hole.

Another feature of the invention is filling through-holes halfway, then filling blind holes that reach down only to horizontal conductors embedded in the dielectric.

BRIEF DESCRIPTION OF THE DRAWINGS

FIGS. 4A and 4B illustrate a prior art module using layers with conductive paste.

DETAILED DESCRIPTION

Figure 1:
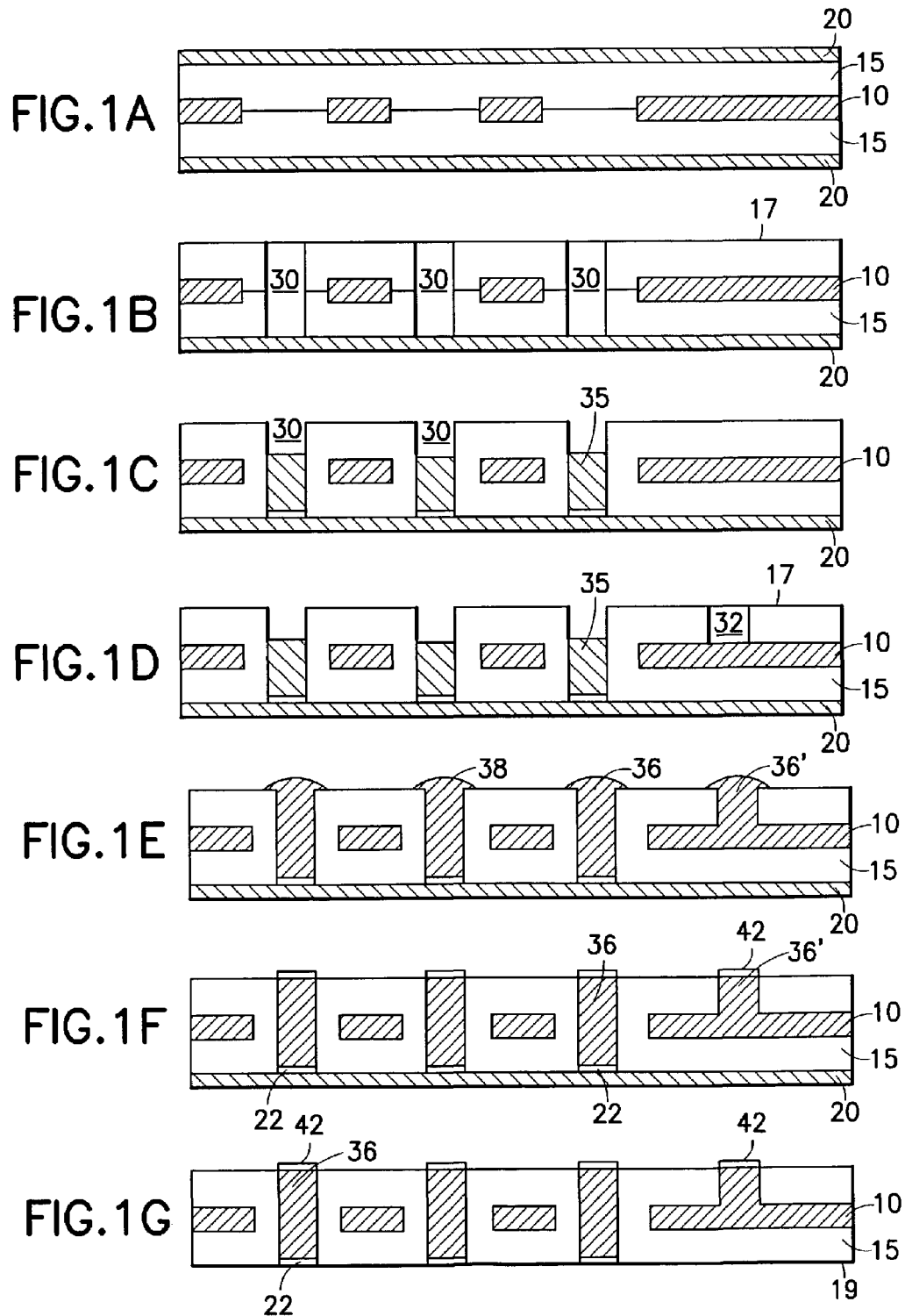
FIGS. 1A through 1G illustrate steps in forming a dielectric sheet according to the invention.

Referring to FIG. 1 (i.e. FIGS. 1A, 1B, 1C, 1D, 1B, and 1F) there is shown a series of steps in making an interconnect structure used in connecting integrated circuits. The starting point is a dielectric sandwich of two copper layers 20 on the top and bottom of two dielectric layers 15, e.g. polymer printed circuit board material. When finished, the layer will be one modules that will be assembled with others to form the interconnect structure.Thus,N such modules may each be formed in accordance with FIG. 1 and assembled together to form the interconnect structure. At the center, horizontal metal members 10 will carry signals into and out of the plane of the paper and left to right in the plane of the paper.

At the next stage, shown in FIG. 1B, upper layer 20 has been removed, e.g. by etching, and vertical holes 30 have been formed in spaces between members 10. Illustratively, the holes are drilled by a laser, though other methods are acceptable. Preferably, the laser drilling is adjusted in power so it stops on the top surface of bottom layer 20, thereby forming a bottom cap in the hole and a starting surface for the plating steps that will follow.

The hole will be filled with copper (referred to in the following claims as the first metal), which is inexpensive and has a high conductivity, but first a bottom cap 22 of Sn (the second metal) is plated on the top of copper bottom layer 20. Sn melts at a lower temperature and therefore solders better to adjacent layers. Typically, a thickness of several microns of Sn is adequate to get the benefit of its superior properties. In an alternative embodiment, described below, there could be two layers of thin metal layers in the bottom of the via 30, referred to as the second and third metals.

The holes 30 are filled by plating copper. In this example, the first plating step only fills the holes 30 to about half their height (denoted 35 in FIG. 1C). A second set of blind holes 32 are formed, as shown in FIG. 1D, stopping on some of the horizontal members 10. These blind holes will be used for horizontal connections. The holes, both holes 30 and 32, are filled with copper, shown as 36 and 36'. The second set of shallow blind visa are optional. If not present, plating of copper in the deeper visa can proceed in a single step. Excess copper will be formed on the top surface of dielectric 15 as part of typical manufacturing practice, shown in FIG. 1E as bumps 38. The excess copper can be removed with chemical-mechanical polishing, leaving a coplanar surface of dielectric and metal.

A corresponding method can be performed on the bottom of the layer, leaving a set of vertical visa that extend along an axis from top to bottom and a set of offset visa (or offset vertical interconnects) that start at one location on the top surface and exit from a location on the bottom surface that is offset from the top location.

A second layer 42 of Sn, (the fourth metal) may then be plated on the top of the copper (shown in FIG. 1F). Advantageously, a mask is not required for this step, since the Sn self-aligns to the copper. The Sn 42 is shown as projecting above the surface 17 of the dielectric, but a slight etching step to recess the copper could be performed if precise planarity is required.

Last, as shown in FIG. 1G, bottom layer 20 of copper is removed, exposing bottom surface 19 of the dielectric layer and the Sn at the base of the visa.

In a subsequent bonding step, Sn contacts that are aligned with a contact vertically above or below will fuse with those other metal contacts to establish continuous electrical connections through surface 17 and a corresponding surface 19 of the next layer. Some of the Sn could be adjacent to a layer of a different material and different structure. Typically, the thickness of the layer that forms caps 42 is about several microns, which is not an obstacle in mechanical alignment or in having the top surface 17 shown in good mechanical contact with an adjacent lower surface 19 of the composite layer above it.

Figure 2:
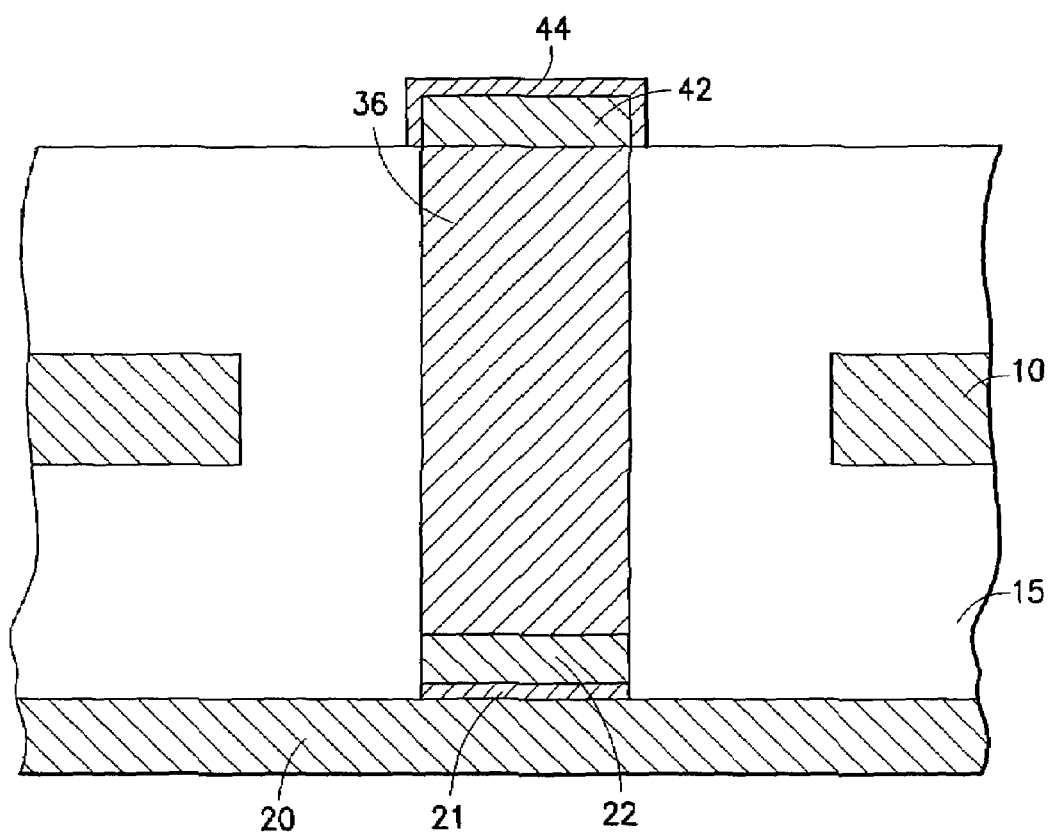
FIG. 2 illustrates a composite via according to the invention.

Referring now to FIG. 2, there is shown in cross section a single via with a more elaborate stucture, before removal of lower layer 20. Copper 36 has been deposited after deposition of a second metal 21, illustratively Au at a bottom cap thickness of 100 to 2000 Angslroms, and a third metal 22, Sn, with an intermediate thickness of several microns. Thus before plating the via with the copper 36, the second metal 21 is plated within the via and on the top surface of the lower layer 20 such that the second metal 21 is in direct mechanical contact with the lower layer 20. The via has a composite bottom cap of the second and third metals. At the top, a layer 42 of fourth metal (Sn) has been plated with a top cap thickness of several microns and a layer 44 of fifth metal (Au) has been plated with a top cover thickness of 100 to 2000 Angstroms. The top has a composite top cap with the layers 42 and 44 of fourth and fifth metals, respectively.

Figure 3A:
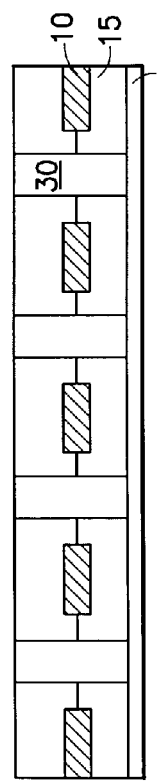
FIGS. 3A through 3D illustrate alternative embodiments of the invention.

Referring now to FIG. 3, there is shown an alternative embodiment, in which FIG. 3A shows a layer with visa 30, open at the bottom. The visa 30 are filled with copper using a process similar to that shown in FIG. 1. The drilled visa stop at the top surface of bottom copper layer 20 in FIG. 3A, which is removed by etching. Excess plated copper on the top or bottom surface is removed by chemical-mechanical polishing.

A blanket layer of copper 120 is deposited on the top surface and then a layer of photoresist 145 is deposited and patterned to leave openings above the visa. Sn 142 and Au 144 are plated on to copper 120, in the opening above the visa. This self-aligned plating step eliminates the need for patterning and etching the metal layers. The result is shown in FIG. 3D, with a set of vertical visa having a composite pad on the top and bottom with an attachment surface of Au. Blind visa could be formed to make contact with horizontal members 10, as was described with respect to FIG. 1.

In this case, the first metal is copper, the second and fourth metals are Sn and the third and fifth metals are Au. In other cases, the identity of the metals may change.

Figure 3B:
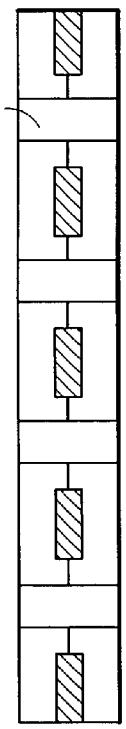
Figure 3C:
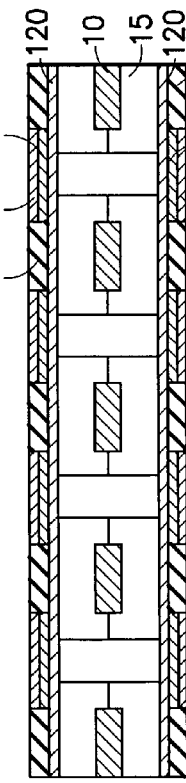
Figure 3D:
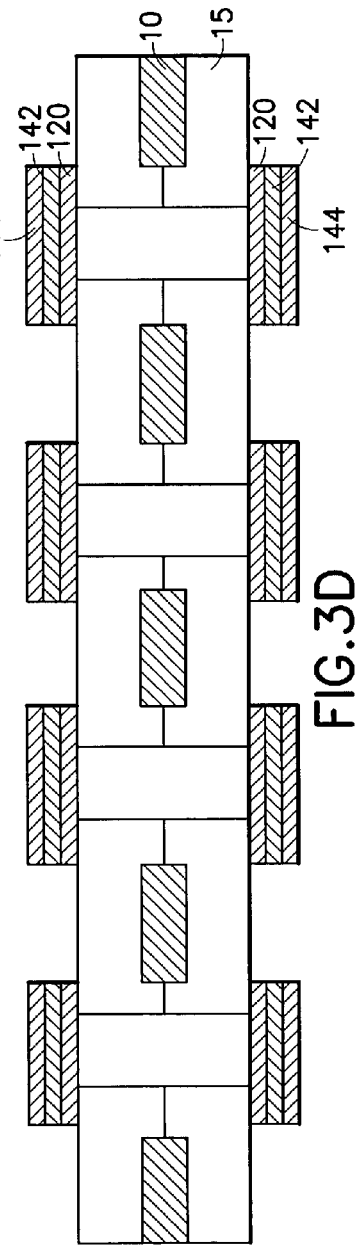

As an alternative to the use of Cu to fill the visa in FIG. 3B, visa can be drilled through the entire thickness of FIG. 3A, including top and bottom layers of Cu, 20. The visa are filled with an electrically conductive paste. A layer of copper 120 is deposited, e.g. by bonding a sheet of copper foil to the top and bottom of the structure. A layer of photoresist 145 is deposited and patterned to leave openings above the visa. Sn 142 and Au 144 are plated on to copper 120, in the opening above the visa. This self-aligned plating step eliminates the need for patterning and etching the metal layers. The result is shown in FIG. 3D, with a set of vertical visa having a composite pad on the top and bottom with an attachment surface of Au. Blind visa could be formed to make contact with horizontal members 10, as was described with respect to FIG. 1. In this case, the first metal is copper, the second and fourth metals are Sn and the third and fifth metals are Au. In other cases, the identity of the metals may change.

In making up a package for ICES, a set of layers is assembled, having the visa and horizontal connections called for in the design. The layers are assembled and bonded together, e.g. by reflowing solder contacts on facing surfaces. Conductive layers are formed on top and bottom surfaces, as in FIG. 4. Solder bumps may be formed on contacts that are fabricated by patterning the conductive layers. One or more ICES are attached to the set of contacts on the top surface and the bottom contacts are attached to a suitable substrate, e.g. a printed circuit board.

While the invention has been described in terms of a single preferred embodiment, those skilled in the art will recognize that the invention can be practiced in various versions within the spirit and scope of the following claims.

What is claimed is:

1. A method of forming an interconnect module by a process comprising the steps of:
    providing at least one sheet of dielectric, at least a bottom surface of the at least one sheet of dielectric being covered with a conductive bottom layer;
    forming a first via through the at least one sheet of dielectric, said first via extending from a top surface o the at least one sheet of dielectric to a top surface of the bottom layer;
    plating the first via with a first metal to form a first vertical member that comprises the first metal, said first vertical member extending from inside the first via to outside the first via;
    removing an excess amount of the first metal from outside the first via, resulting in a top surface of the first vertical member being coplanar with the top surface of the at least one dielectric sheet; and
    before the step of plating the first via with the first metal, plating a second metal within the first via and on the top surface of the bottom layer such that the second metal is in direct mechanical contact with the bottom layer.

2. The method of claim 1, wherein the first metal is copper (Cu), and wherein the second metal is gold (Au).

3. The method of claim 1, said process further comprising the step of:
    after the step of plating the second metal within the first via and before the step of plating the first via with the first metal, plating the first via with a third metal on a top surface of the second metal, wherein the third metal is in direct mechanical contact with the second metal.

4. The method of claim 3, said process further comprising the step of:
    after the step of removing the excess amount of the first metal from outside the first via, plating a fourth metal on a top surface of the first metal in the first via such that the fourth metal is in direct mechanical contact with the first metal in the first via.

5. The method of claim 3, wherein the first metal is copper, wherein the third metal is tin (Sn), and wherein the second metal is gold (Au).

6. The method of claim 1, said process further comprising the step of:
    after the step of removing the excess amount of the first metal from outside the first via plating a fourth metal on a top surface of the first metal in the first via such that the fourth metal is in direct mechanical contact with the first metal in the first via.

7. The method of claim 6, said process further comprising the step of:
    plating a fifth metal on the fourth metal such that the fifth metal is in direct mechanical contact with the fourth metal.

8. The method of claim 6, wherein plating the fourth metal comprises plating the fourth metal, without use of a mask, on the top surface of the first metal in the first via.

9. The method of claim 1, said process further comprising the steps of:
    laminating a set of horizontal metal members, separated by spaces in a horizontal plane between a first dielectric sheet of the at least one sheet of dielectric and a second dielectric sheet of the at least one sheet of dielectric, wherein a bottom surface of the second dielectric sheet is in direct mechanical contact with the conductive bottom layer;
    forming a second via extending from the top surface of the at least one sheet of dielectric to a top surface of a first metal member of the horizontal metal members, wherein the second via passes through the first dielectric sheet;
    plating the second via with the first metal to form a second vertical member that comprises the first metal, said second vertical member extending from inside the second via to outside the second via: and
    removing an excess amount of the first metal from outside the second via, resulting in a top surface of the second vertical member being coplanar with the top surface of the at least one dielectric sheet and a bottom surface of the second vertical member being coplanar with a bottom surfaces of the first dielectric sheet.

10. The method of claim 9, said process further comprising the step of:
    after the step of removing the excess amount of the first metal from outside the second via, plating a fourth metal on a top surface of the first metal in the second via such that the fourth metal is in direct mechanical contact with the first metal in the second via.

11. The method of claim 10, said process further comprising the step of:
    plating a fifth metal on the fourth metal such that the fifth metal is in direct mechanical contact with the fourth metal.

12. The method of claim 10, wherein plating the fourth metal comprises plating the fourth metal, without use of a mask, on the top surface of the first metal in the second via.

13. The method of claim 9, said process further comprising the step of:
    after the step of plating die second metal within the first via and before the step of plating the first via with the first metal, plating the first via with a third metal on a top surface of the second metal, wherein the third metal is in direct mechanical contact with the second metal, and wherein the step of plating the first via with the first metal results in the first metal being in direct mechanical contact with the third metal.

14. The method of claim 13, said process further comprising the step of:
    after the step of removing the excess amount of the first metal from outside the second via, plating a fourth metal on a top surface of the second metal in the second via such that the fourth metal is in direct mechanical contact with the first metal in the second via.

15. A method of forming an interconnect structure having N interconnect modules, said method comprising forming each interconnect module of the N interconnect modules, followed by bonding the N interconnect modules together to form the interconnect structure wherein each interconnect module of the N interconnect modules is formed by a process comprising the steps of:
    providing at least one sheet of dielectric, at least a bottom surface of the at least one sheet of dielectric being covered with a conductive bottom layer;
    forming a first via through the at least one sheet of dielectric, said first via extending from a top surface of the at least one sheet of dielectric to a top surface of the bottom layer;
    plating time first via with a first metal to form a first vertical member that comprises the first metal, said first vertical member extending from inside the first via to outside the first via;
    removing an excess amount of the first metal from outside the first via, resulting in a top surface of the first vertical member being coplanar with the top surface of the at least one dielectric sheet; and
    after the step of forming the first via and before the step of plating the first via with the first metal, plating a second merit within the first via and on the top surface of the bottom layer such that the second metal is in direct mechanical contact with the bottom layer.

16. The method of claim 15, wherein the first metal is copper (Cu), and wherein the second metal is gold (Au).

17. The method of claim 15, said process further comprising the step of:
    plating the first via with a third metal on a top surface of the second metal, wherein the third metal is in direct mechanical contact with the second metal.

18. The method of claim 17, wherein the first metal is copper, wherein the third metal is tin (Sn), and wherein the second metal is gold (Au).

19. The method of claim 15 said process further comprising the step of:
    after the step of removing the excess amount of the first metal from outside the first via, plating a fourth metal on a top surface of the first metal in the first via such that the fourth metal is in direct mechanical contact with the first metal in the first via.

20. The method of claim 19, said process further comprising the step of:
    plating a fifth metal on the fourth metal such that the fifth metal is in direct mechanical contact with the fourth metal.

21. The method of claim 15 said process further comprising the steps of:
    laminating a set of horizontal metal members, separated by spaces in a horizontal plane between a first dielectric sheet of the at least one sheet of dielectric and a second dielectric sheet of the at least one sheet of dielectric, wherein a bottom surface of the second dielectric sheet is in direct mechanical contact with the conductive bottom layer;
    forming a second via extending from the top surface of the at least one sheet of dielectric to a top surface of a first metal member of the horizontal metal members, wherein the second via passes through the first dielectric sheet;

plating the second via with the first metal to form a second vertical member that comprises the first metal, said second vertical member extending from inside the second via to outside the second via; and removing an excess amount of the first metal from outside the second via, resulting in a top surface of the second vertical member being coplanar with the top surface of the at least one dielectric sheet and a bottom surface of the second vertical member being coplanar with a bottom surfaces of the first dielectric sheet.

22. The method of claim 21 said process further comprising the step of:

after the stop of removing the excess amount of the first metal from outside the second via, plating a fourth metal on a top surface of the first metal in the second via such that the fourth metal is in direct mechanical contact with the first metal in the second via.

23. The method of claim 22, said process further comprising the step of:

plating a fifth metal on the fourth metal such that the fifth metal is in direct mechanical contact with the fourth metal.

24. The method of claim 21 said process further comprising the step of:

after the step of plating the second metal within the first via and before the step of plating the first via with the first metal, plating the first via with a third metal on a top surfice of the second metal, wherein the third metal is in direct mechanical contact with the second metal, and wherein the step of plating the first via with the first metal results in the first metal being in direct mechanical contact with the third metal.

25. The method of claim 24, said process further comprising the stop of:

after the step of removing the excess amount of the first metal from outside the second via, plating a fourth metal on a top surface of the first metal in the second via such that the fourth metal is in direct mechanical contact with the first metal in the second via.

26. The method of claim 17 said process further comprising the step of:

after the step of removing the excess amount of the first metal from outside the first via, plating a fourth metal on a top surface of the first metal in the first via such that the fourth metal is in direct mechanical contact with the first metal in the first via.

27. The method of claim 15, wherein said bonding the N interconnect modules together establishes a module top surface of the interconnect structure, said process further comprising the steps of providing patterns of horizontal interconnect members and visa between the lop surface of the at least one sheet of dielectric and the bottom layer to establish a designed set of interconnections, said method further comprising:

forming a set of contact pads on the module top surface, said set of contact pads adopted for making contact to at least one integrated circuit, said set of contact pads being connected to the set of interconnections formed in each interconnect module of the N interconnect modules.

28. The method of claim 27, wherein a first contact pad of the set of contact pads comprises a layer of Sn on the module top surface and a layer of Au on the layer of Sn such that the layer of Sn is sandwiched between the module top surface and the layer of Au.

\* \* \* \* \*

UNITED STATES PATENT AND TRADEMARK OFFICE
CERTIFICATE OF CORRECTION

PATENT NO. : 7,083,901 B2
APPLICATION NO. : 10/262724
DATED : August 1, 2006
INVENTOR(S) : Egitto et al.

It is certified that error appears in the above-identified patent and that said Letters Patent is hereby corrected as shown below:

TITLE PAGE, ITEM (57) in the Abstract
Line 1, delete "ICES" and insert -- ICs --

Column 1
Line 62, delete "layer metal layer" and insert -- metal layer --

Column 2
Line 18, delete "1D, 1B" and insert -- 1D, 1E --
Lines 65 and 66, delete "visa" and insert -- vias --

Column 3
Lines 12, 41, 42, 43, 50, 52, 54, 56, 61, 62, 63, and 67, delete "visa" and insert -- vias --
Line 28, delete "Angslroms" and insert -- Angstroms --

Column 4
Lines 2, 4, 6, and 13, delete "visa" and insert -- vias --
Lines 12 and 19, delete "ICES" and insert -- ICs --
Line 34, delete "o" and insert -- of --

Column 5
Line 4, delete "via plating" and insert -- via, plating --

Column 6
Line 22, delete "time" and insert -- the --
Line 32, delete "merit" and insert -- metal --

Column 7
Line 16, delete "stop" and insert -- step --

UNITED STATES PATENT AND TRADEMARK OFFICE
CERTIFICATE OF CORRECTION

PATENT NO. : 7,083,901 B2
APPLICATION NO. : 10/262724
DATED : August 1, 2006
INVENTOR(S) : Egitto et al.

It is certified that error appears in the above-identified patent and that said Letters Patent is hereby corrected as shown below:

<u>Column 8</u>
Line 19, delete " visa" and insert -- vias --
Line 19, delete "lop" and insert -- top--

Signed and Sealed this

Fourteenth Day of November, 2006

JON W. DUDAS
*Director of the United States Patent and Trademark Office*